United States Patent [19]

Bansal

[11] 4,418,401
[45] Nov. 29, 1983

[54] LATENT IMAGE RAM CELL
[75] Inventor: Jai P. Bansal, Manassas, Va.
[73] Assignee: IBM Corporation, Armonk, N.Y.
[21] Appl. No.: 454,314
[22] Filed: Dec. 29, 1982
[51] Int. Cl.³ .................... G11C 17/00; G11C 11/40
[52] U.S. Cl. ........................................ 365/95; 365/156
[58] Field of Search ................. 365/95, 156; 307/279

[56] References Cited

U.S. PATENT DOCUMENTS

| | | | |
|---|---|---|---|
| 3,662,351 | 5/1972 | Ho et al. | |
| 3,755,793 | 8/1973 | Ho et al. | |
| 3,798,621 | 3/1974 | Baitlinger et al. | |
| 3,801,967 | 4/1974 | Berger et al. | |
| 3,820,086 | 6/1974 | Ho et al. | |
| 3,820,088 | 6/1974 | Hadni et al. | |
| 4,149,268 | 4/1979 | Waters | 365/95 |
| 4,207,615 | 6/1980 | Mar | 365/95 |
| 4,289,982 | 9/1981 | Smith | 365/95 |

FOREIGN PATENT DOCUMENTS 54-146935  11/1979  Japan ........................ 365/95

OTHER PUBLICATIONS

Balasubramanian et al., "Monolithic Storage Cell Having Inherent Latent Image Memory Operation", IBM Tech. Disc. Bul., vol. 17, No. 12, 5/75, pp. 3634–3635.

Primary Examiner—Stuart N. Hecker
Attorney, Agent, or Firm—John E. Hoel

[57] ABSTRACT

An asymmetric RAM cell is disclosed which will have a predictable initial storage state when pulsed drain voltage is turned on and yet after the initial turn-on interval, will operate in a symmetric fashion storing either binary ones or zeros. Thus, an initial prestored set of information can be permanently provided in a memory array made up of such cells, by orienting each individual cell at the time of manufacture so as to selectively represent either a binary one or zero. This is illustrated in the FIGURE where the upper cell has a first state by virtue of its orientation and the lower cell has a second, opposite state by virtue of its relative opposite orientation. When the array is turned on, the upper cell will have the opposite binary state from the lower cell. Thereafter, each cell can be respectively switched for storing ones and zeros in a normal RAM operating mode.

2 Claims, 1 Drawing Figure

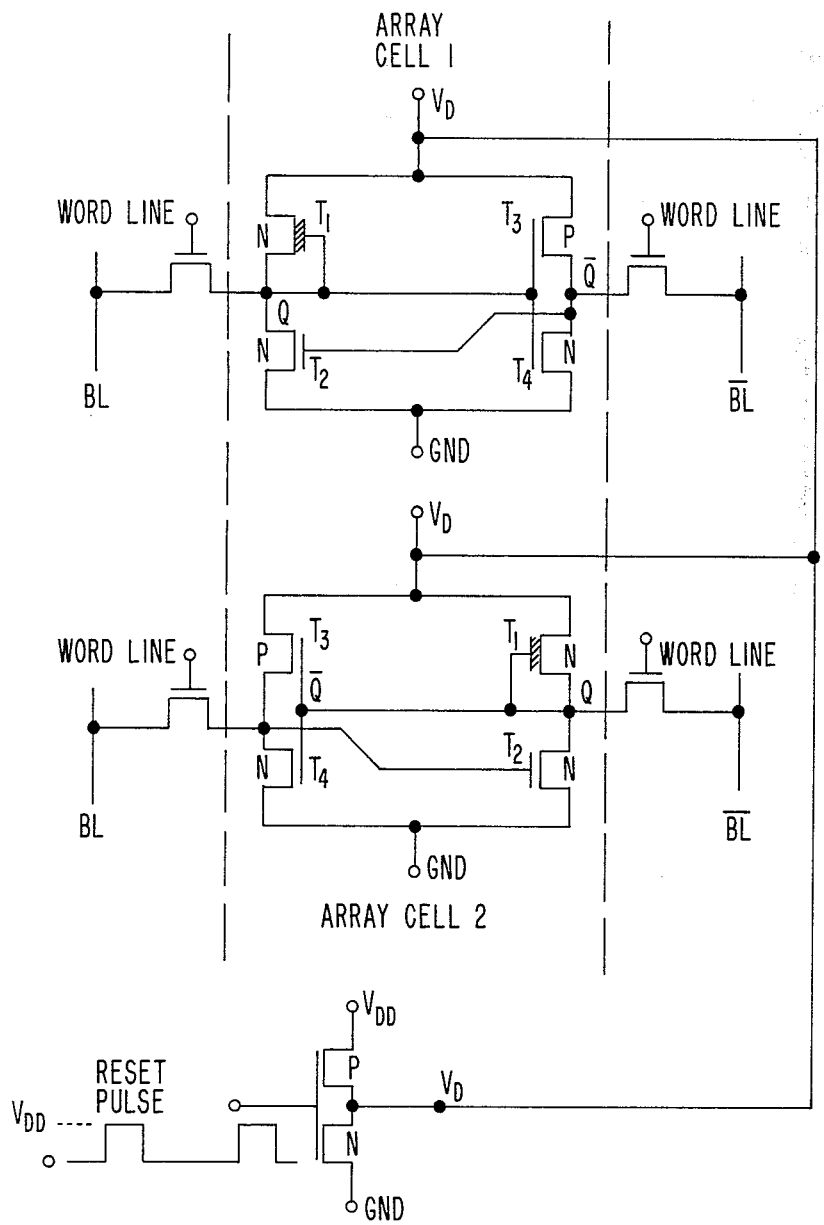

LATENT IMAGE RAM CELL

FIELD OF THE INVENTION

The invention disclosed broadly relates to memory circuits and more particularly relates to FET memory circuits.

BACKGROUND OF THE INVENTION

Latent image memory circuits have been disclosed in the prior art, which are capable of assuming a predefined binary state when power is turned on to the circuit. Prior art circuits employing bipolar transistor technology include U.S. Pat. Nos. 3,662,351; 3,801,967; and 3,820,086. Another approach to latent image memory circuits is described in U.S. Pat. No. 3,755,793 which discloses the use of both FET devices and charge coupled devices to obtain the latent image memory operation. Still another approach to achieving latent image memory operation employing single conductivity type FET transistor technology is described in U.S. Pat. No. 3,798,621, wherein FET devices can be selectively added to a basic cross-coupled RAM storage cell, to achieve both read/write and read only memory operations.

What is required is a more simplified circuit topology suitable for implementation in a complementary MOSFET technology.

OBJECTS OF THE INVENTION

It is therefore an object of the invention to provide an improved latent image memory cell.

It is still a further object of the invention to provide an improved latent image memory cell which has a more simplified topology than that exhibited by the prior art.

It is still a further object of the invention to provide an improved latent image memory cell which is suitable for implementation in complementary MOSFET technology.

SUMMARY OF THE INVENTION

These and other objects, features and advantages of the invention are achieved by the latent image RAM cell. An asymmetric RAM cell is disclosed which will have a predictable initial storage state when power to cell is turned on and yet after the initial turn-on interval, will operate in a symmetric fashion storing either binary ones or zeros. Thus, an initial prestored set of information can be permanently provided in a memory array made up of such cells, by orienting each individual cell at the time of manufacture so as to selectively represent either a binary one or zero. This is illustrated in the figure where the upper cell has a first state by virtue of its orientation and the lower cell has a second, opposite state by virtue of its relative opposite orientation. When power to the array is turned on, the upper cell will have the opposite binary state from the lower cell. Thereafter, each cell can be respectively switched for storing ones and zeros in a normal read/write memory (RAM) operating mode.

DESCRIPTION OF THE FIGURES

These and other objects, features and advantages of the invention will be more fully appreciated with reference to the accompanying FIGURE.

FIG. 1 illustrates two of the latent image RAM cells in a circuit.

DISCUSSION OF THE PREFERRED EMBODIMENT

An asymmetric RAM cell is disclosed which will have a predictable initial storage state when power to the cell circuit is turned on and yet after the initial turn-on interval, will operate in a symmetric fashion storing either binary ones or zeros. Thus, an initial prestored set of information can be permanently provided in a memory array made up of such cells, by orienting each individual cell at the time of manufacture so as to selectively represent either a binary one or zero. This is illustrated in the FIGURE where the upper cell has a first state by virtue of its orientation and the lower cell has a second, opposite state by virtue of its relative opposite orientation. When power to the array is turned on, the upper cell will have the opposite binary state from the lower cell. Thereafter, each cell can be respectively switched for storing ones and zeros in a normal RAM operating mode.

As is seen in the FIGURE, each storage cell is comprised of four FET devices organized into inverters. The first inverter includes the depletion mode N channel FET device $T_1$ and the enhancement mode N channel FET device $T_2$. A second inverter includes complementary MOS transistors, $T_3$ which is P channel and $T_4$ which is N channel. By means of the cross coupling connection shown in the FIGURE between the node Q and the gates of $T_3$ and $T_4$ and between $\overline{Q}$ and the gate of $T_2$, the circuits can store either a binary one or a binary zero by having either the node Q or the node $\overline{Q}$ at a high potential. When the drain voltage $V_D$ to the cell circuit is switched from ground potential zero volts to high potential $V_D$ volts, node Q starts charging up the first time the threshold voltage of the N channel depletion mode device $T_1$ is more negative than the threshold voltage of the P channel FET device $T_3$ ($-2.0$ volts vs $-1.0$ volt respectively). As the node Q potential rises above the threshold voltage ($+1.0$ volt) of N channel enhancement mode device $T_4$, device $T_4$ starts conducting and keeps the node $\overline{Q}$ from rising up in potential.

Hence after $F_D$ is switched on from zero to $F_D$ volts, node Q rises to $V_D$ volts which is the binary one and node $\overline{Q}$ is discharged to ground potential which is the down level corresponding to a binary zero. Down level at node $\overline{Q}$ in turn keeps device $T_2$ in its nonconducting state and the cell circuit stays in this latched state, providing a latent image operation for the cell. This state remains until the cell is operated as a RAM circuit by selectively applying positive or ground potential to the first or the second node to store an alternate binary state in the cell.

Two latent image storage cells are shown in the FIGURE, each storage cell being shown with an N channel depletion mode load FET device $T_1$ having its drain/source path connected between a pulsed drain voltage $V_D$ and a first node Q, and having its gate connected to the first node Q. A first N channel enhancement mode FET device $T_2$ is shown having its drain/source path connected between the first node Q and ground potential, and its gate connected to a second node $\overline{Q}$. A P channel enhancement mode FET device $T_3$ is shown having its source/drain path connected between the second node $\overline{Q}$ and the pulsed drain potential $V_D$, and its gate connected to the first node Q. A second N channel enhancement mode FET device $T_4$ is shown having its drain/source path connected between the second node $\overline{Q}$ and the ground potential, and having its gate connected to the first node Q.

The first node Q charges up faster than the second node $\overline{Q}$ when the pulsed drain voltage $V_D$ turns positive or on, providing a latent image operation for the circuit. The state of a storage cell consisting of devices $T_1$ through $T_4$ can then be read in the conventional manner by turning on the word line connected to that cell and sensing the relative potential at Q and $\overline{Q}$ over the bit lines BL and $\overline{BL}$. The upper storage cell 1 in the FIGURE is oriented oppositely from the lower storage cell 2 and thus the two cells will have opposite initial binary states.

Thereafter, the storage cell operates symmetrically as a RAM circuit. For example the upper storage cell 1 in the FIGURE can be written into by selectively applying positive or ground potential to the first node Q from the bit line BL or to the second node $\overline{Q}$ from the bit line $\overline{BL}$ to store a selected binary state in the storage cell until the next write operation for that cell.

The FIGURE shows a latent image read only memory and read/write memory circuit which includes a first bit line BL and a second bit line $\overline{BL}$ and a plurality of storage cells with a first cell being the upper cell shown in the FIGURE and a second cell being the lower cell shown in the FIGURE. Each of the storage cells is switchably connected to the first bit line BL and the second bit line $\overline{BL}$ by means of a word line signal on a corresponding one of a plurality of word lines. Each word line in a circuit is uniquely connected to only one of the storage cells for any given pair of bit lines BL and $\overline{BL}$. The upper storage cell 1 consisting of its transistors $T_1$, $T_2$, $T_3$ and $T_4$, has its node Q connected through a first word line transistor to the bit line $\overline{BL}$ and its node $\overline{Q}$ connected through a second word line transistor to the bit line BL, so that the upper cell 1 will provide a first binary state latent memory operation when the pulsed drain voltage $V_D$ initially goes positive. The second or lower storage cell 2 in the FIGURE has its transistors $T_1$, $T_2$, $T_3$ and $T_4$ connected so that its node Q is selectively connected through a word line transistor to the bit line $\overline{BL}$ and its node $\overline{Q}$ selectively connected through a word line transistor to the bit line BL, to correspond to a second binary state latent image operation when the pulsed drain voltage $V_D$ initially turns positive. The word line which connects the node Q to the bit line BL and the node $\overline{Q}$ to the bit line $\overline{BL}$ for the upper array cell 1 is a different word line from the word line which enables the connection of the node $\overline{Q}$ to the bit line $\overline{BL}$ and the node Q to the bit line BL in the lower array cell 2 of the FIGURE. A simple CMOS inverter is employed to generate the pulsed $V_D$ drain voltage which is applied to the $V_D$ terminal of the array cell 1 and the array cell 2 in the FIGURE.

At the initial turn-on of the pulsed drain voltage $V_D$, the node Q of the array cell 1 will be at a higher potential than the node $\overline{Q}$ and thus when the word line connected to the array cell 1 is turned on, the bit line BL will sense a higher voltage than will the bit line $\overline{BL}$. This will be interpreted by a sense amplifier connected to the bit lines BL and $\overline{BL}$, as a binary one numeric value having being permanently stored in the array cell 1. Correspondingly, when a separate word line connected to the word line transistors in the array cell 2 is turned on, the higher potential of the node Q in the array cell 2 relative to the lower potential of the node $\overline{Q}$ in the array cell 2, will be sensed as a higher potential at the bit line BL and a lower potential at the bit line BL. The sense amplifier will then interpret the permanently stored binary state of the array cell 2 as being a binary zero value.

After the initial turn-on state has been achieved for the array cells 1 and 2, each cell can be independently switched in a read/write mode by selectively turning on the corresponding word line to a particular storage cell and then forcing the relative potential of the bit lines BL and $\overline{BL}$ so that the storage cell selected by the word line assumes a first or second binary state. For example, in the read/write mode, a binary zero state can be written into the upper array cell 1 by turning on the word line transistors connected to the array cell 1 and biasing the potential of the bit line $\overline{BL}$ to be relatively lower than the bit line potential of $\overline{BL}$. This will force the gate of the transistors $T_3$ and $T_4$ to a relatively low potential, thereby forcing the node $\overline{Q}$ to be at a relatively high potential, corresponding to the relatively high potential at the bit line $\overline{BL}$. Correspondingly, the relatively high potential at the node $\overline{Q}$ will turn on the transistor $T_2$, thereby lowering the potential at the node Q, corresponding to the lower potential at the bit line BL. Thus, the cross coupled interconnection of the transistors $T_1$, $T_2$, $T_3$ and $T_4$ in the array cell 1 will latch the relative voltages of the bit lines BL and $\overline{BL}$ as applied through the word line transistors connected thereto. The word line connected to the array cell 1 can then be reduced in potential, and the written state will be latched into the array cell 1, independent of the state of any other cells connected to the pair of bit lines BL and $\overline{BL}$. Read/write memory operations for the lower array cell 2 can be carried out in the same manner.

A desired ROS personality is configured by arranging the cell 1 type and cell 2 type in the array at the time of manufacture. After the initial power turn-on, the array could be used as ROS or RAM. The array can be reset to the ROS mode any time during the regular functional operation by the reset pulse which consists of bringing the drain power supply $V_D$ to ground potential for an interval of a few nanoseconds, then raising it to $V_D$ volts. This provides RAM/ROS function from the same array during the operation of the equipment in which the device is used.

This simple circuit topology enables a latent image operation for read only memory applications and yet permits dynamic binary information storage for random access memory operation. The disclosed circuit has a more simplified topology than that which is exhibited in the prior art.

Although a specific embodiment of the invention has been disclosed, it will be understood by those of skill in the art that the foregoing and other changes in form and details may be made therein without departing from the spirit and the scope of the invention.

Having thus described our invention, what we claim as new, and desire to secure by Letters Patent is:

1. A latent image storage cell, comprising:
- an N channel depletion mode load FET device having its drain/source path connected between a pulsed drain voltage and a first node, having its gate connected to said first node;
- a first N channel enhancement mode FET device having its drain/source path connected between said first node and ground potential, and its gate connected to a second node;

a P channel enhancement mode FET device having its drain/source path connected between said pulsed drain voltage and said second node, and its gate connected to said first node;

a second N channel enhancement mode FET device having its source/drain path connected between said second node and said ground potential, and having its gate connected to said first node;

said first node charging up faster than said second node when said pulsed drain voltage turns on, providing a latent image operation for the circuit, the circuit operating as a RAM circuit by selectively applying positive or ground potential to said first or said second node to dynamically store a selected binary state in the circuit.

2. A latent image read only memory and read/write memory circuit including a first and a second bit line and a plurality of storage cells, each said storage cell being switchably connected to said first and second bit lines by a word line signal on a corresponding one of a plurality of word lines, the circuit comprising:

a first latent image storage cell in said circuit, comprising:

a first N channel depletion mode load FET device having its drain/source path connected between a pulsed drain voltage and a first node, having its gate connected to said first node, said first node being switchably connected by means of a first word line signal to said first bit line;

a first N channel enhancement mode FET device having its drain/source path connected between said first node and ground potential, and its gate connected to a second node, said second node being switchably connected by means of said first word line signal to said second bit line;

a first P channel enhancement mode FET device having its drain/source path connected between said pulsed drain voltage and said second node, and its gate connected to said first node;

a second N channel enhancement mode channel FET device having its drain/source path connected between said second node and said ground potential, and having its gate connected to said first node;

said first node charging up faster than said second node when said pulsed drain voltage turns on, providing a first binary state latent image operation for said first cell, said first cell operating as a read/write memory by selectively applying positive or ground potential to said first or said second node to dynamically store a selected binary state in said first cell;

a second latent image storage cell in said circuit, comprising:

a second N channel depletion mode load FET device having its drain/source path connected between said pulsed drain voltage and a third node, having its gate connected to said third node, said third node being switchably connected by means of a second word line signal to said second bit line;

a third N channel enhancement mode FET device having its drain/source path connected between said third node and ground potential, and its gate connected to a fourth node, said fourth node being switchably connected by means of said second word line signal to said first bit line;

a second P channel enhancement mode FET device having its drain/source path connected between said pulsed drain voltage and said fourth node, and its gate connected to said third node;

a fourth N channel enhancement mode FET device having its drain/source path connected between said fourth node and said ground potential, and having its gate connected to said third node;

said third node charging up faster than said fourth node when said pulsed drain voltage turns on, providing a second binary state latent image operation for said second cell opposite from said first binary state for said first cell, said second cell operating as a read/write memory by selectively applying positive or ground potential to said third or said fourth node to dynamically store a selected binary state in said second cell.

* * * * *